(12) United States Patent
Ko

(10) Patent No.: US 8,335,124 B2
(45) Date of Patent: Dec. 18, 2012

(54) EXTERNAL SIGNAL INPUT CIRCUIT OF SEMICONDUCTOR MEMORY

(75) Inventor: Jae Bum Ko, Ichon (KR)

(73) Assignee: SK Hynix Inc., Gyeonggi-do (KR)

( * ) Notice: Subject to any disclaimer, the term of this patent is extended or adjusted under 35 U.S.C. 154(b) by 159 days.

(21) Appl. No.: 12/839,341

(22) Filed: Jul. 19, 2010

(65) Prior Publication Data

US 2011/0211405 A1    Sep. 1, 2011

(30) Foreign Application Priority Data

Feb. 26, 2010 (KR) .................. 10-2010-0017744

(51) Int. Cl.
*G11C 8/00* (2006.01)
(52) U.S. Cl. ................. 365/230.03; 365/230.08
(58) Field of Classification Search ............. 365/230.03, 365/230.08, 191, 194; 710/301
See application file for complete search history.

(56) References Cited

U.S. PATENT DOCUMENTS

| | | | |
|---|---|---|---|
| 6,961,281 B2 * | 11/2005 | Wong et al. ............. | 365/230.03 |
| 7,391,238 B2 | 6/2008 | Kim et al. | |
| 7,500,050 B2 | 3/2009 | Gill et al. | |
| 7,543,102 B2 | 6/2009 | Jacob et al. | |
| 2008/0080292 A1 * | 4/2008 | Djordevic ............... | 365/230.06 |
| 2008/0212391 A1 * | 9/2008 | Sohn et al. ................ | 365/227 |
| 2009/0032928 A1 | 2/2009 | Chiang et al. | |
| 2009/0091962 A1 | 4/2009 | Chung et al. | |
| 2009/0166873 A1 | 7/2009 | Yang et al. | |
| 2009/0248994 A1 | 10/2009 | Zheng et al. | |
| 2010/0118582 A1 * | 5/2010 | Choi ............................ | 365/63 |

FOREIGN PATENT DOCUMENTS

| | | |
|---|---|---|
| JP | 2007-164599 | 6/2007 |
| KR | 1020080083796 A | 9/2008 |
| KR | 1020080108854 A | 12/2008 |

* cited by examiner

*Primary Examiner* — Vu Le
(74) *Attorney, Agent, or Firm* — William Park & Associates Ltd.

(57) ABSTRACT

In one embodiment, an external signal input circuit of a semiconductor memory may include: an input block configured to receive a plurality of external signals and to generate a plurality of internal signals; and a control block configured to output one or more internal signals of the plurality of internal signals that correspond to a rank configuration of the semiconductor memory and to block output of one or more internal signals of the plurality of internal signals that do not correspond to the rank configuration.

6 Claims, 6 Drawing Sheets

EXTERNAL SIGNAL INPUT CIRCUIT OF SEMICONDUCTOR MEMORY

CROSS-REFERENCES TO RELATED APPLICATION

The present application claims priority under 35 U.S.C. §119(a) to Korean Application No. 10-2010-0017744, filed on Feb. 26, 2010, in the Korean Intellectual Property Office, which is incorporated herein by reference as if set forth in its entirety.

BACKGROUND

1. Technical Field

The present invention relates to semiconductor memory, and more particularly, to external signal input circuits in a semiconductor memory.

2. Related Art

A semiconductor memory may have a single-rank configuration or multi-rank configuration.

The semiconductor memory may include an external signal input circuit configured to receive external signals such as a clock enable signal CKE and an impedance adjustment signal ODT.

FIG. 1A illustrates an external signal input circuit 10 of one conventional semiconductor memory having a single-rank configuration. The external signal input circuit 10 may include two input units 11 and 12 configured to buffer a clock enable signal CKE and an impedance adjustment signal ODT, respectively, to generate internal signals CKE_$i$ and ODT_$i$.

FIG. 1B illustrates an external signal input circuit 20 of another conventional semiconductor memory having a multi-rank configuration, such as two or four ranks. The external signal input circuit 20 may include four input units 21 through 24 configured to buffer first clock enable signal CKE0, second clock enable signal CKE1, first impedance adjustment signal ODT0, and second impedance adjustment signal ODT1, respectively, to generate internal signals CKE_$i$ and ODT_$i$.

Here, the first clock enable signal CKE0 and second clock enable signal CKE1 may be combined to instruct a desired rank among the multi ranks to activate the clock signal.

Furthermore, the first impedance adjustment signal ODT0 and second impedance adjustment signal ODT1 may be combined to instruct a desired rank among the multi ranks to perform impedance control.

In this case, the input units 11, 12, and 21 through 24 may be configured in the same manner. Each one of the input units may control a setup/hold time of a signal buffered by an internal buffer and may drive and output the signal.

As described above, the external signal input circuits of the conventional semiconductor memories are configured in different manners based on the rank configurations thereof, that is, the single rank and the multi ranks.

The external signal input circuit 10 for the single-rank configuration may not be used in the multi-rank configuration, and the external signal input circuit 20 for the multi-rank configuration may not be used in the single-rank configuration.

SUMMARY

Disclosed embodiments provide external signal input circuits of semiconductor memory that may be used in both a single-rank configuration and a multi-rank configuration.

In one exemplary embodiment, an external signal input circuit of a semiconductor memory is provided, including, for example: an input block configured to receive a plurality of external signals and to generate a plurality of internal signals; and a control block configured to output one or more internal signals of the plurality of internal signals that correspond to a rank configuration of the semiconductor memory and to block output of one or more internal signals of the plurality of internal signals that do not correspond to the rank configuration.

In another exemplary embodiment, an external signal input circuit of a semiconductor memory is provided, including, for example: a first input unit configured to receive a first external signal to generate a first internal signal; a second input unit configured to receive a second external signal to generate a second internal signal; a first control unit configured to receive the first internal signal and output the first internal signal; and a second control unit configured to block an output of the second internal signal based on a rank configuration of the semiconductor memory.

In another exemplary embodiment, an external signal input circuit of a semiconductor memory is provided, including, for example: a first input unit configured to output a first buffering signal as a first internal signal, the first buffering signal being generated by receiving a first external signal; and a second input unit configured to select one of the first buffering signal and a second buffering signal, generated by receiving a second external signal, based on a rank configuration of the semiconductor memory and to output the selected buffering signal as a second internal signal. The second input unit may be configured to block an input of the second external signal based on the rank configuration.

BRIEF DESCRIPTION OF THE DRAWINGS

Features, aspects, and embodiments are described in conjunction with the attached drawings, in which.

DETAILED DESCRIPTION

Figure 1A:
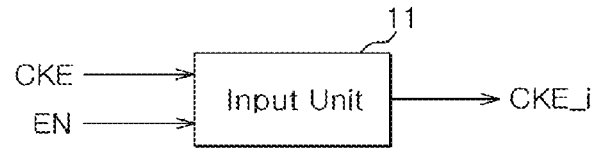
FIG. 1A is a block diagram of one conventional external signal input circuit of conventional a semiconductor memories.
Figure 1A:
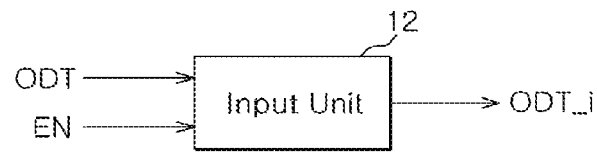
Figure 1B:
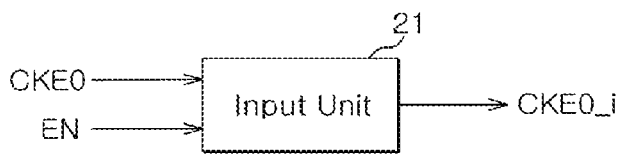
FIG. 1B is a block diagram of another conventional external signal input circuit of conventional semiconductor memories.
Figure 1B:
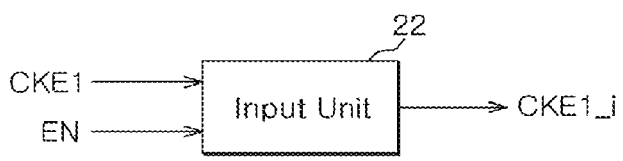
Figure 1B:
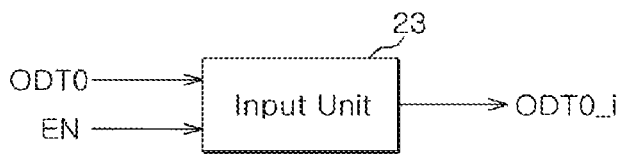
Figure 1B:
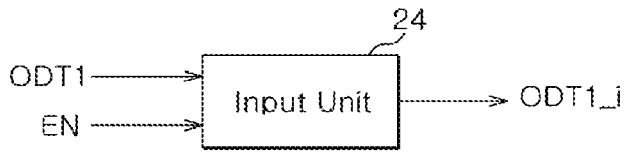

Reference will now be made in detail to the exemplary embodiments consistent with the present disclosure, examples of which are illustrated in the accompanying drawings. Whenever possible, same reference numerals will be used throughout the drawings to refer to the same or like parts.

An external signal input circuit of a semiconductor memory may receive a clock enable signal CKE and an impedance adjustment signal ODT as external signals necessary for distinguishing rank configuration.

Figure 2:
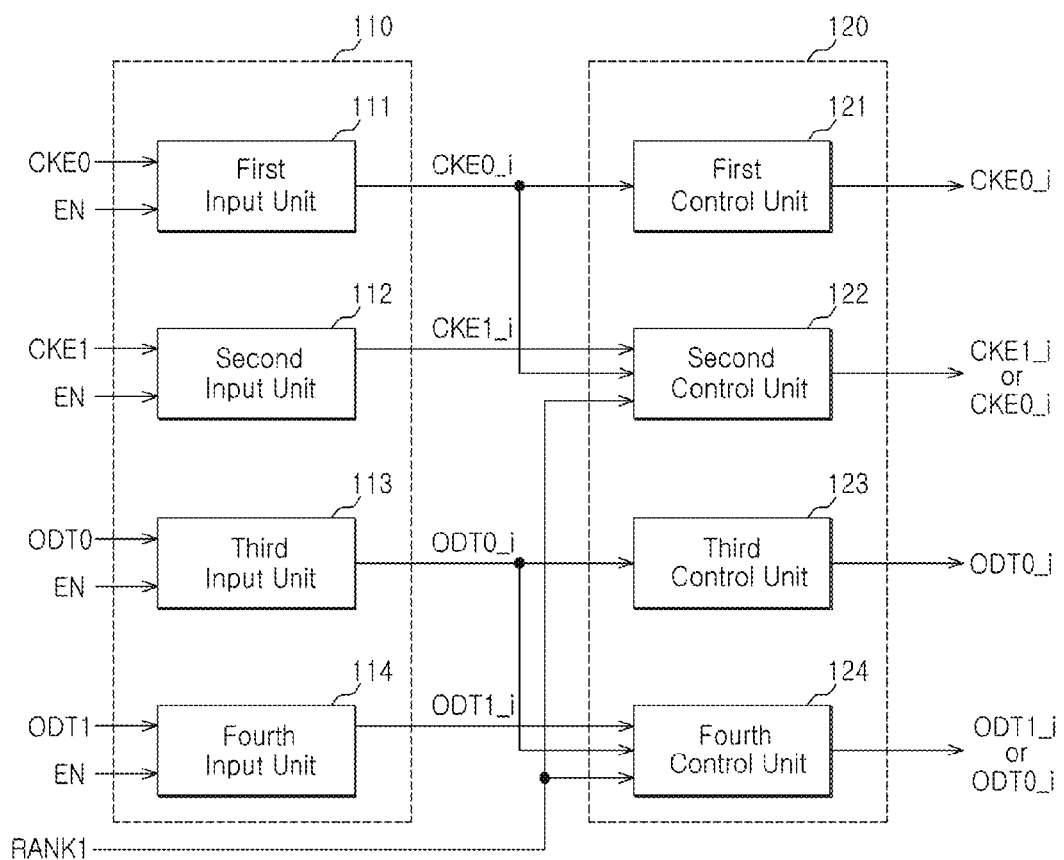
FIG. 2 is a block diagram of an external signal input circuit of a semiconductor memory according to one embodiment of the invention.

FIG. 2 is a block diagram of an external signal input circuit 100 of the semiconductor memory in accordance with one embodiment of the present invention. The external signal input circuit 100 may include an input block 110 and a control block 120. The input block 110 may be configured to receive a plurality of external signals CKE0, CKE1, ODT0, and ODT1 to generate a plurality of internal signals CKE0_$i$, CKE1_$i$, ODT0_$i$, and ODT1_$i$.

The external signals CKE0 and ODT0 may be signals that are commonly used in a single-rank configuration and a multi-rank configuration. The external signals CKE1 and ODT1 may be external signals that may not be used in the single-rank configuration, but may only be used in the multi-rank configuration.

The input block 110 may include a first input unit 111, a second input unit 112, a third input unit 113, and a fourth input unit 114.

The first input unit 111 may be configured to receive the external signal CKE0 in response to activation of an enable signal EN and to generate the internal signal CKE0_$i$. The second input unit 112 may be configured to receive the external signal CKE1 in response to activation of the enable signal EN and to generate the internal signal CKE1_$i$.

The third input unit 113 may be configured to receive the external signal ODT0 in response to activation of the enable signal EN and to generate the internal signal ODT0_$i$.

The fourth input unit 114 may be configured to receive the external signal ODT1 in response to activation of the enable signal EN and to generate the internal signal ODT1_$i$.

The control block 120 may be configured to output internal signals corresponding to the rank configuration of the semiconductor memory, among the plurality of internal signals CKE0_$i$, CKE1_$i$, ODT0_$i$, and ODT1_$i$, and to block the output of internal signals that do not correspond to the rank configuration. That is, the control block 120 may be configured to output the internal signals CKE0_$i$ to and ODT0_$i$ and to block the output of the internal signals CKE1_$i$ and ODT1_$i$, when the semiconductor memory has the single-rank configuration.

Furthermore, the control block 120 may be configured to output all the internal signals CKE0_$i$, CKE1_$i$, ODT0_$i$, and ODT1_$i$, when the semiconductor memory has the multi-rank configuration.

The control block 120 may include first control block 121, second control block 121, third control block 123, and fourth control block 124.

The first control unit 121 may be configured to receive the internal signal CKE0_$i$ and to output the internal signal CKE0_$i$.

The second control unit 122 may be configured to block the output of any one of the two internal signals CKE0_$i$ and CKE1_$i$ and to select and output the other internal signal, according to a rank signal RANK1.

The rank signal RANK1 may define the single-rank configuration and the multi-rank configuration. For example, when the semiconductor memory has the single-rank configuration, the rank signal RANK1 may be a high-level signal. When the semiconductor memory has the multi-rank configuration, the rank signal RANK1 may be a low-level signal.

The third control unit 123 may be configured to receive the internal signal ODT0_$i$ and output the internal signal ODT0_$i$.

The fourth control unit 124 may be configured to block the output of any one of the two internal signals ODT0_$i$ and ODT1_$i$ and select and output the other internal signal, according to the rank signal RANK1.

Figure 3A:
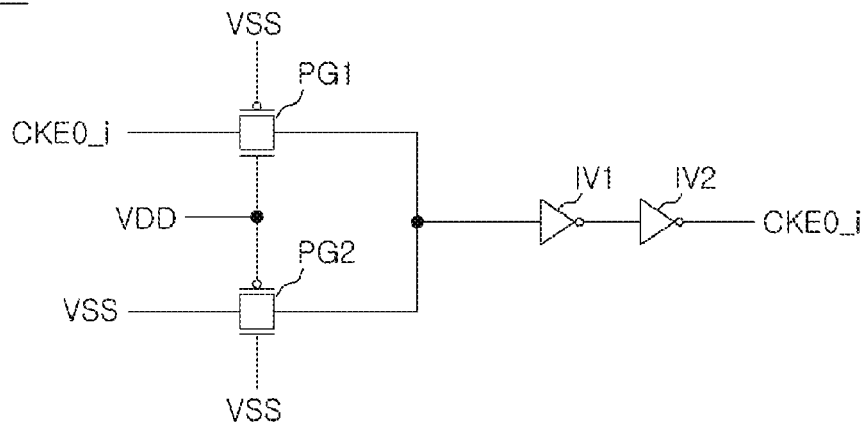
FIG. 3A is a circuit diagram of one exemplary embodiment of the first control unit shown in FIG. 2.

FIG. 3A is a circuit diagram of one exemplary embodiment of the first control unit 121 shown in FIG. 2. The first control unit 121 may include a plurality of pass gates PG1 and PG2 and a plurality is of inverters IV1 and IV2. Since a PMOS gate of the pass gate PG1 and an NMOS gate and an input terminal of the pass gate PG2 may be grounded, the first control unit 121 may receive the internal signal CKE0_$i$ and output the internal signal CKE0_$i$.

Figure 3B:
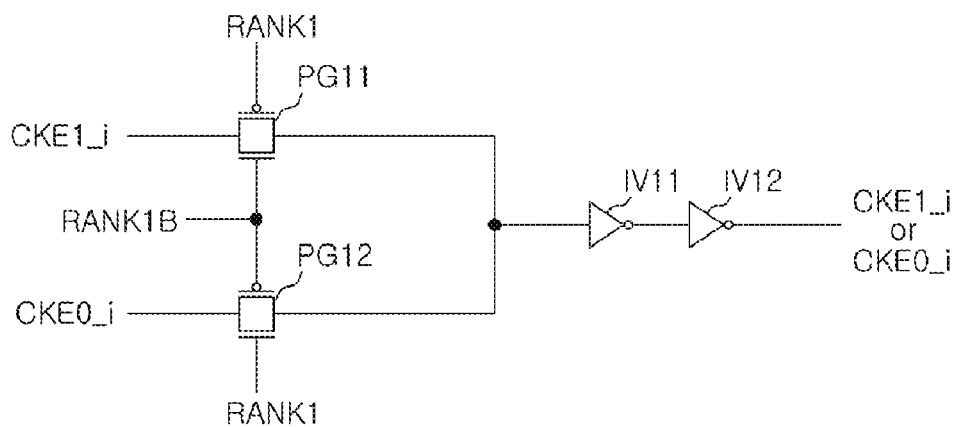
FIG. 3B is a circuit diagram of one exemplary embodiment of the second control unit shown in FIG. 2.

FIG. 3B is a circuit diagram of one exemplary embodiment of the second control unit 122 shown in FIG. 2. The second control unit 122 may include a plurality of pass gates PG11 and PG12 and a plurality of inverters IV11 and IV12.

The rank signal RANK1 may be inputted to a PMOS gate of the pass gate PG11, an inverted rank signal RANK1B may be inputted to an NMOS gate, and the internal signal CKE1_$i$ may be inputted to an input terminal.

The inverted rank signal RANK1B may: be inputted to a PMOS gate of the pass gate PG2, the rank signal RANK1 may be inputted to an NMOS gate, and the internal signal CKE0_$i$ may be inputted to an input terminal.

When the rank signal RANK1 is a high-level signal defining the single-rank configuration, the pass gate PG11 may be turned off and the pass gate PG12 may be turned on. Therefore, the second control unit 122 may block the input of the internal signal CKE0_$i$ and to output the internal signal CKE0_$i$ through the pass gate PG12 and the inverters IV1 and IV2.

When the rank signal RANK1 is a low-level signal defining the multi-rank configuration, the pass gate PG12 may be turned off, and the pass gate PG11 may be turned on. Therefore, the second control unit 122 may block the input of the internal signal CKE0_$i$ and may output the internal signal CKE1_$i$ through the pass gate PG11 and the inverters IV1 and IV2.

The third control unit 123 may be configured in the same manner as the first control unit 121, except for receiving the internal signal ODT0_i.

The fourth control unit 124 may be configured in the same manner as the second control unit 122, except for receiving the internal signals ODT0_$i$ and ODT1_$i$.

When the rank signal RANK1 is a high-level signal defining the single-rank configuration, the fourth control unit 124 may block the input of the internal signal ODT1_$i$ and output the internal signal ODT0_$i$.

When the rank signal RANK1 is a low-level signal defining the multi-rank configuration, the fourth control unit 124 may block the input of the internal signal ODT0_$i$ and output the internal signal ODT1_$i$.

As the first through fourth control units 121 through 124 may have the same circuit configuration, internal signal processing times of the first through fourth control units 121 through 124 may become substantially the same.

In the above-described embodiment, when the semiconductor memory has the single-rank configuration, the first control unit 121 may output the internal signal CKE0_$i$, the second control unit 122 may output the internal signal CKE0_$i$, the third control unit 123 may output the internal signal ODT0_$i$, and the fourth control unit 124 may output the internal signal ODT0_$i$.

When the output signal of the second control unit 122 is deactivated in the single rank, for example, when the output signal is fixed to a low level, it may affect the internal signal CKE0_i outputted from the first control unit 121.

Therefore, the second control unit 122 may be configured to output the same signal as that outputted from the first control unit 121. The third and fourth control units 123 and 124 may be operated in the same manner.

Meanwhile, when the semiconductor memory according to the embodiment has the multi-rank configuration, the first control unit 121 may output the internal signal CKE0_i, the second control unit 122 may output the internal signal CKE1_i, the third control unit 123 may output the internal signal ODT0_i, and the fourth control unit 124 may output the internal signal ODT1_i.

Figure 4:
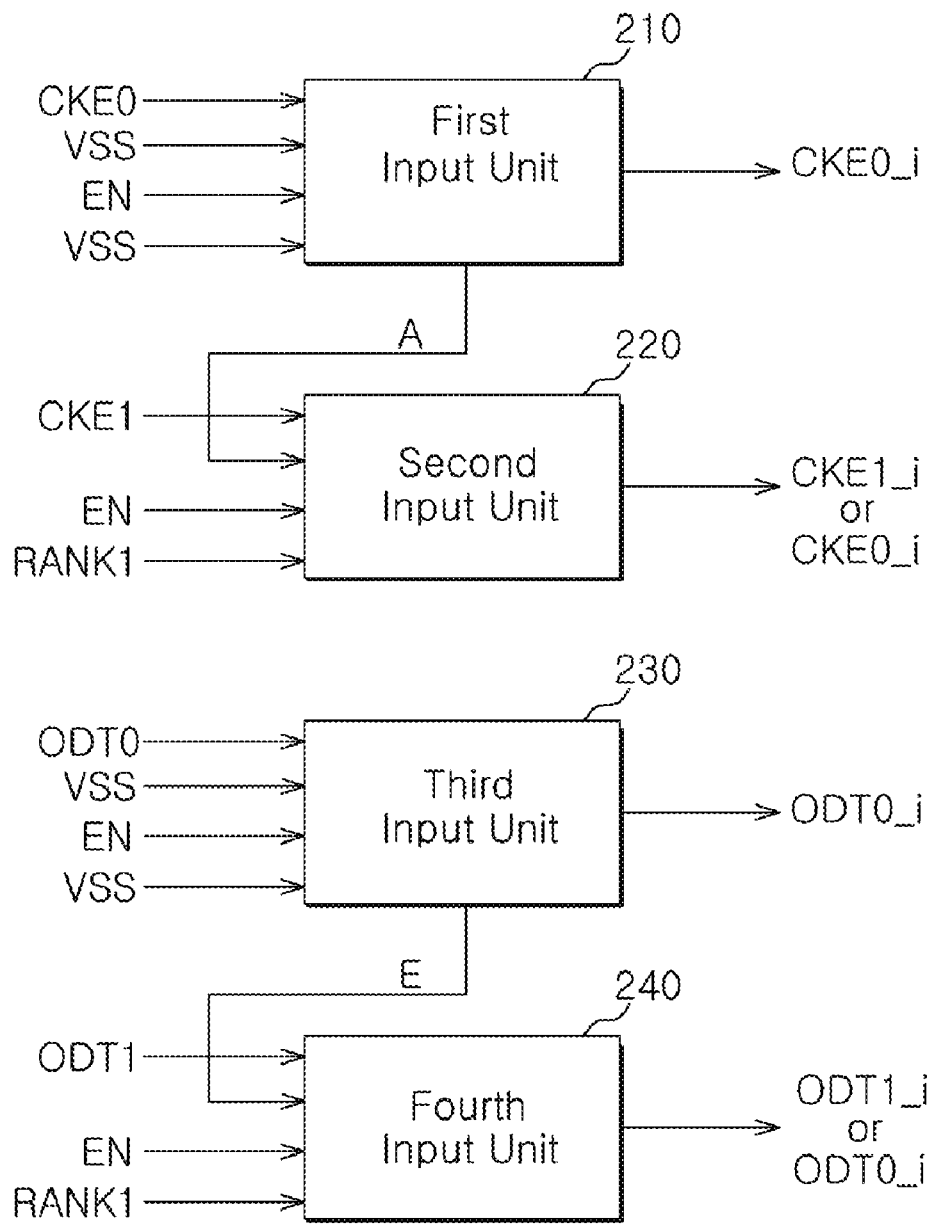
FIG. 4 is a block diagram of an external signal input circuit of a semiconductor memory according to another embodiment of the invention.

FIG. 4 illustrates an external signal input circuit 200 of a semiconductor memory according to another embodiment of the invention. The external signal input circuit 200 may include first input unit 210, second input unit 220, third input unit 230, and fourth input unit 240.

The first input unit 210 may be configured to receive an external signal CKE0 and outputs an internal signal CKE0_i.

The second input unit 220 may be configured to receive an external signal CKE1 and a buffering signal A in response to a rank signal RANK1. The second input unit 220 may be further configured to output an internal signal CKE0_i or CKE1_i.

The third input unit 230 may be configured to receive an external signal ODT0 and output an internal signal ODT0_i.

The fourth input unit 240 may be configured to receive an external signal ODT1 and a buffering signal E in response to the rank signal RANK1. The second input unit 240 may be further configured to output an internal signal ODT0_i or ODT1_i.

In this case, the third input unit 230 may be configured in the same manner as the first input unit 210, except for receiving the external signal ODT0. Furthermore, the fourth input unit 240 may be configured in the same manner as the second input unit 220, except for receiving the external signal ODT1 and the buffering signal E.

Figure 5:
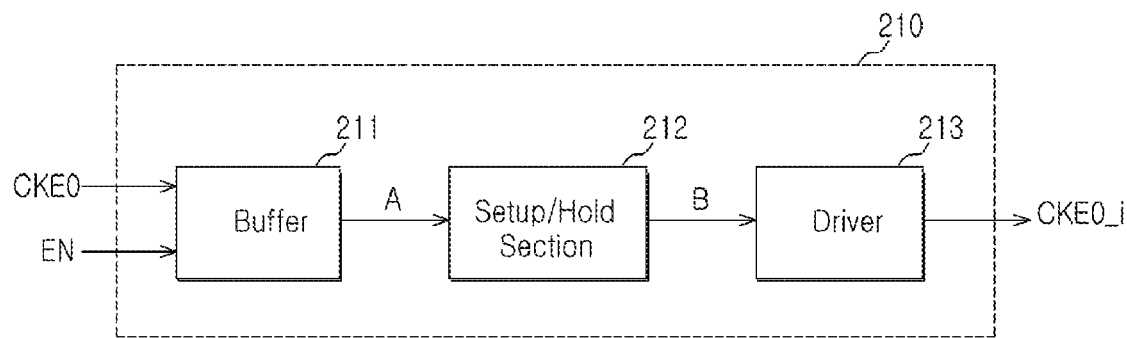
FIG. 5 is a block diagram illustrating the internal configuration of one exemplary embodiment of a first input unit shown in FIG. 4.

FIG. 5 illustrates the internal configuration of one exemplary embodiment of the first input unit 210 shown in FIG. 4. The first input unit 210 may include a buffer 211, a setup/hold section 212, and a driver 213.

The buffer 211 may be configured to receive the external signal CKE0 in response to activation of an enable signal EN and to generate the buffering signal A.

The setup/hold section 212 may be configured to generate an output signal B by controlling a setup/hold time of the buffering signal A.

The driver 213 may be configured to drive the output signal B of the setup/hold section 212 to output the internal signal CKE0_i.

Figure 6:
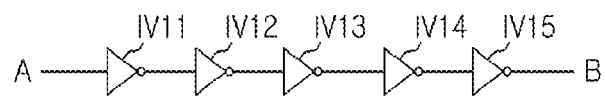
FIG. 6 is a circuit diagram of one exemplary embodiment of the setup/hold section shown in FIG. 5.

FIG. 6 is a circuit diagram of one exemplary embodiment of the setup/hold section 212 shown in FIG. 5. The setup/hold section 212 may include a plurality of inverters IV11, IV12, IV13, IV14, and IV15.

The setup/hold section 212 may generate the output signal B by delaying the buffering signal A by a time determined by the plurality of inverters IV11 through IV15.

Figure 7:
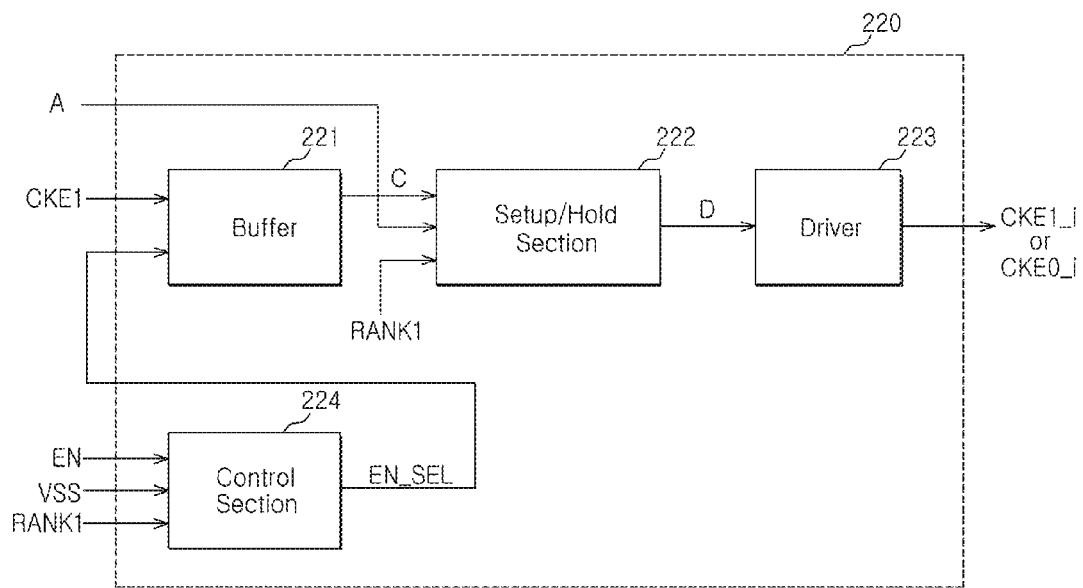
FIG. 7 is a block diagram illustrating the internal configuration of one exemplary embodiment of the second input unit shown in FIG. 4.

FIG. 7 illustrates the internal configuration of one exemplary embodiment of the second input unit 220 shown in FIG. 4. The second input unit 220 may include a buffer 221, a setup/hold section 222, and a control section 224.

When the rank signal RANK1 is a low-level signal defining the multi-rank configuration, the control section 224 may output the enable signal EN as a control signal EN_SET. On the other hand, when the rank signal RANK1 is a high-level signal defining the single-rank configuration, the control section 224 may output a deactivation level of the enable signal EN, that is, a ground level as a control signal EN_SEL.

The control section 224 may be configured in the same manner as the second control section unit of FIG. 3B. However, unlike in FIG. 3B, the control section 224 may receive the enable signal EN instead of the internal signal CKE1_i and may be connected to a ground terminal VSS instead of the internal signal CKE0_i.

The buffer 221 may be configured to receive the external signal CKE1 in response to the control signal EN_SEL and may is generate a buffering signal C.

The setup/hold section 222 may be configured to select one of the buffering signals A and C based on the rank signal RANK1 and to output an output signal D by controlling a setup/hold time of the selected signal.

The driver 223 may be configured to drive the output signal D of the setup/hold section 222 to output the internal signal CKE0_i or CKE1_i.

Figure 8:
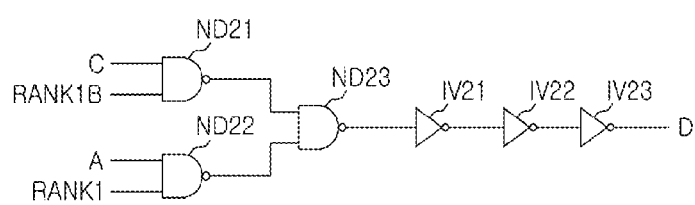
FIG. 8 is a circuit diagram of one exemplary embodiment of the setup/hold section shown in FIG. 7.

FIG. 8 is a circuit diagram of one exemplary embodiment of the setup/hold section 222 shown in FIG. 7. The setup/hold section 222 may include a plurality of NAND gates ND21, ND22, and ND23 and a plurality of inverters IV21, IV22, and IV23.

When the rank signal RANK1 is a high-level signal defining the single-rank configuration, the setup/hold section 222 may control the setup/hold time of the output signal D by passing the buffering signal A through the plurality of NAND gates ND21 through ND23 and the plurality of inverters IV21 through IV23.

When the rank signal RANK1 is a low-level signal defining the multi-rank configuration, the setup/hold section 222 may control the setup/hold time of the output signal D by passing the buffering signal C through the plurality of NAND gates ND21 through ND23 and the plurality of inverters IV21 through IV23.

The setup/hold section 222 of FIG. 8 is designed, in the example, in such a manner that the number of logic elements through which the buffering signal A or C passes corresponds to five (the NAND gates ND21 or ND22 and ND23 and the inverters IV21 through IV23).

Furthermore, the setup/hold section 212 of FIG. 6 is designed, in the example, in such a manner that the number of logic elements through which the buffering signal A passes corresponds to five (the inverters IV11 through IV15).

Therefore, the setup/hold time of the output signal D in the setup/hold section 222 of FIG. 8 may be set to be substantially the same as the setup/hold time of the output signal B in the setup/hold section 212 of FIG. 6.

When a skew exists between the output signals of the buffers 211 and 221, the setup/hold times of the setup/hold sections 212 and 222 of the first through fourth input units 210 through 240, may be controlled to reduce the skew between the output signals of the buffers 211 and 221. That is, the circuit design may be performed in different manners by adjusting the numbers of inverters or the size of the inverters in the setup/hold sections 212 and 222. Then, it may be possible to reduce the skew between the output signals of the buffers 211 and 221.

When the semiconductor memory according to this embodiment has the single-rank configuration, the first input unit 210 may output the internal signal CKE0_i, the second input unit 220 may output the internal signal CKE0_i, the third input unit 230 may output the internal signal ODT0_i, and the fourth input unit 240 may outputs the internal signal ODT0_i.

The second input unit 220 may be configured to output the same signal as that outputted by the first input unit 210 and the fourth input unit 240 may be configured to output the same signal as that outputted by the third input unit 230, in order to minimize the effect between the internal signals.

When the semiconductor memory has the multi-rank configuration, the first input unit 210 may output the internal signal CKE0_i, the second input unit 220 may output the internal signal CKE1_i, the third input unit 230 may output the internal signal ODT0_i, and the fourth input unit 240 may output the internal signal ODT1_i.

According to embodiments of the invention, the external signal input circuit of the semiconductor memory may be used regardless of a rank configuration. Therefore, separate circuit design is not required, and the external signal input may be easily applied to products.

While certain embodiments have been described above with reference to illustrative examples for particular applications, it will be understood to those skilled in the art that the embodiments described are by way of example only. Those skilled in the art with access to the teachings provided in this disclosure will recognize additional modifications, applications, and/or embodiments and additional fields in which the present disclosure would be of significant utility. Accordingly, the external signal input circuit of the semiconductor memory described herein should not be limited based on the described embodiments. Rather, the external signal input circuit of the semiconductor memory described herein should only be limited in light of the claims that follow when taken in conjunction with the above description and accompanying drawings.

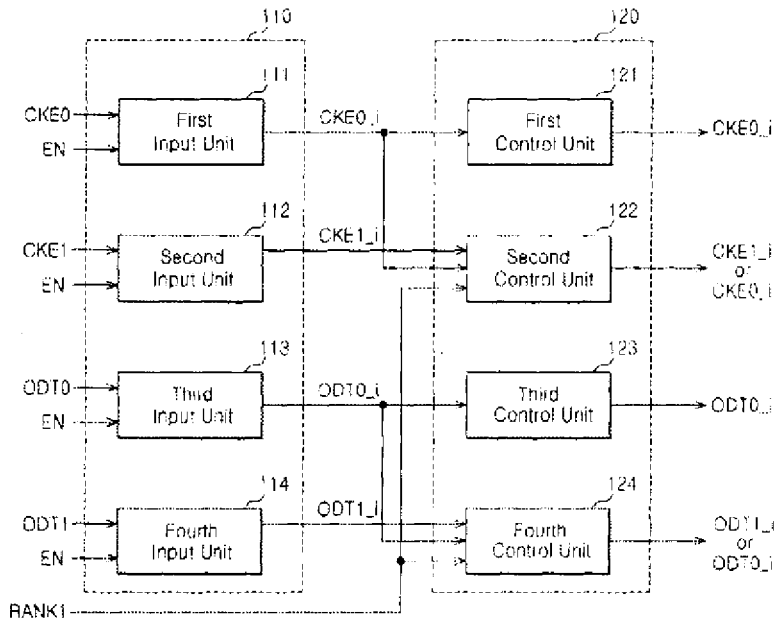

What is claimed is:

1. An external signal input circuit of a semiconductor memory, comprising:
    an input block configured to receive a plurality of external signals and to generate a plurality of internal signals; and
    a control block configured to output one or more internal signals of the plurality of internal signals that correspond to a rank configuration of the semiconductor memory in response to a rank signal and to block output of one or more internal signals of the plurality of internal signals that do not correspond to the rank configuration in response to the rank signal.

2. The external signal input circuit according to claim 1, wherein the rank signal defines the rank configuration as a single-rank configuration or a multi-rank configuration.

3. An external signal input circuit of a semiconductor memory, comprising:
    a first input unit configured to receive a first external signal to generate a first internal signal;
    a second input unit configured to receive a second external signal to generate a second internal signal;
    a first control unit configured to receive the first internal signal and output the first internal signal; and
    a second control unit configured to block an output of the second internal signal in response to a rank signal.

4. The external signal input circuit according to claim 3, wherein the rank signal defines the rank configuration as a single-rank configuration or a multi-rank configuration.

5. An external signal input circuit of a semiconductor memory, comprising:
    a first input unit configured to output a first buffering signal as a first internal signal, the first buffering signal being generated by receiving a first external signal; and
    a second input unit configured to select one of the first buffering signal and a second buffering signal, generated by receiving a second external signal, in response to a rank signal and to output the selected buffering signal as a second internal signal,
    wherein the second input unit is configured to block an input of the second external signal in response to the rank signal.

6. The external signal input circuit according to claim 5, wherein the second input unit comprises:
    a buffer configured to receive the second external signal in response to a control signal and to generate the second buffering signal;
    a control section configured to receive an enable signal and to output the enable signal as the control signal based on the rank signal; and
    a setup/hold section configured to select one of the first buffering signal and the second buffering signal based on the rank signal and to control a setup/hold time of the selected buffering signal.

* * * * *

UNITED STATES PATENT AND TRADEMARK OFFICE
CERTIFICATE OF CORRECTION

Page 1 of 3

PATENT NO. : 8,335,124 B2
APPLICATION NO. : 12/839341
DATED : December 18, 2012
INVENTOR(S) : Jae Bum Ko It is certified that error appears in the above-identified patent and that said Letters Patent is hereby corrected as shown below:

Delete the title page and substitute the attached title page therefor.

In the Claims

Beginning in U.S. Patent No. 8,335,124, column 8, line 42, please insert the following:

--7. The external signal input circuit according to claim 1, wherein the control block comprises:
a first control unit configured to receive a first internal signal of the plurality of internal signals and to output the first internal signal; and
a second control unit configured to select and output one of the first internal signal and a second internal signal of the plurality of internal signals.

8. The external signal input circuit according to claim 7, wherein the first internal signal is a signal corresponding to a single-rank configuration and a multi-rank configuration.

9. The external signal input circuit according to claim 7, wherein the second internal signal is a signal corresponding only to a multi-rank configuration.

10. The external signal input circuit according to claim 7, wherein the second control unit selects and outputs the first internal signal when the semiconductor memory has a single-rank configuration, and wherein the second control unit selects and outputs the second internal signal when the semiconductor memory has a multi-rank configuration.

11. The external signal input circuit according to claim 3, wherein the first external signal and the second external signal are signals defining the same type of command.

12. The external signal input circuit according to claim 3, wherein each one of the first external signal and the second external signal comprises a clock enable signal or an impedance adjustment signal.

Signed and Sealed this
First Day of April, 2014

Michelle K. Lee
*Deputy Director of the United States Patent and Trademark Office*

13. The external signal input circuit according to claim 3, wherein the second control unit selects and outputs the first internal signal when the semiconductor memory has a single-rank configuration, and
wherein the second control unit selects and outputs the second internal signal when the semiconductor memory has a multi-rank configuration.

14. The external signal input circuit according to claim 5, wherein the first input unit is configured to control a setup/hold time of the first buffering signal by delaying the first buffering signal by a preset time.

15. The external signal input circuit according to claim 14, wherein the second input unit is configured to control a setup/hold time of the selected buffering signal by delaying the selected buffering signal by the preset time.

16. The external signal input circuit according to claim 5, wherein the first input unit comprises:
a buffer configured to receive the first external signal in response to an enable signal and to generate the first buffering signal; and
a setup/hold section configured to control a setup/hold time of the first buffering signal.

17. The external signal input circuit according to claim 6, wherein the control section is configured to output the enable signal as the control signal when the rank signal is a level signal defining multi-rank configuration.

18. The external signal input circuit according to claim 6, wherein the control section is configured to output a deactivation level of the enable signal as the control signal when the rank signal is a level signal defining single-rank configuration.--

(12) United States Patent
Ko

(10) Patent No.: US 8,335,124 B2
(45) Date of Patent: Dec. 18, 2012

(54) EXTERNAL SIGNAL INPUT CIRCUIT OF SEMICONDUCTOR MEMORY

(75) Inventor: Jae Bum Ko, Ichon (KR)

(73) Assignee: SK Hynix Inc., Gyeonggi-do (KR)

(*) Notice: Subject to any disclaimer, the term of this patent is extended or adjusted under 35 U.S.C. 154(b) by 159 days.

(21) Appl. No.: 12/839,341

(22) Filed: Jul. 19, 2010

(65) Prior Publication Data
US 2011/0211405 A1 Sep. 1, 2011

(30) Foreign Application Priority Data
Feb. 26, 2010 (KR) .................. 10-2010-0017744

(51) Int. Cl.
*G11C 8/00* (2006.01)
(52) U.S. Cl. .................. 365/230.03; 365/230.08
(58) Field of Classification Search .......... 365/230.03, 365/230.08, 191, 194; 710/301
See application file for complete search history.

(56) References Cited

U.S. PATENT DOCUMENTS

| | | | |
|---|---|---|---|
| 6,961,281 B2 * | 11/2005 | Wong et al. | 365/230.03 |
| 7,391,238 B2 | 6/2008 | Kim et al. | |
| 7,500,050 B2 | 3/2009 | Gill et al. | |
| 7,543,102 B2 | 6/2009 | Jacob et al. | |
| 2008/0080292 A1* | 4/2008 | Djordevic | 365/230.06 |
| 2008/0212391 A1* | 9/2008 | Sohn et al. | 365/227 |
| 2009/0032928 A1 | 2/2009 | Chiang et al. | |
| 2009/0091962 A1 | 4/2009 | Chung et al. | |
| 2009/0166873 A1 | 7/2009 | Yang et al. | |
| 2009/0248994 A1 | 10/2009 | Zheng et al. | |
| 2010/0118582 A1* | 5/2010 | Choi | 365/63 |

FOREIGN PATENT DOCUMENTS

| | | |
|---|---|---|
| JP | 2007-164599 | 6/2007 |
| KR | 1020080083796 A | 9/2008 |
| KR | 1020080108854 A | 12/2008 |

* cited by examiner

*Primary Examiner* — Vu Le
(74) *Attorney, Agent, or Firm* — William Park & Associates Ltd.

(57) ABSTRACT

In one embodiment, an external signal input circuit of a semiconductor memory may include: an input block configured to receive a plurality of external signals and to generate a plurality of internal signals; and a control block configured to output one or more internal signals of the plurality of internal signals that correspond to a rank configuration of the semiconductor memory and to block output of one or more internal signals of the plurality of internal signals that do not correspond to the rank configuration.

18 Claims, 6 Drawing Sheets